(12) United States Patent
Brown

(10) Patent No.: US 7,365,435 B2
(45) Date of Patent: Apr. 29, 2008

(54) ALTERNATING MICRO-VIAS AND THROUGHBOARD VIAS TO CREATE PCB ROUTING CHANNELS IN BGA INTERCONNECT GRID

(75) Inventor: Paul James Brown, Wakefield (CA)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 11/200,044

(22) Filed: Aug. 10, 2005

(65) Prior Publication Data
US 2007/0035005 A1    Feb. 15, 2007

(51) Int. Cl.
*H01L 23/48* (2006.01)
(52) U.S. Cl. .................................................... 257/774
(58) Field of Classification Search ............... 257/774, 257/734–738, E23.011
See application file for complete search history.

(56) References Cited

U.S. PATENT DOCUMENTS

| | | | | |
|---|---|---|---|---|
| 6,373,139 | B1 * | 4/2002 | Clark | 257/774 |
| 6,534,872 | B1 * | 3/2003 | Freda et al. | 257/774 |
| 2004/0099440 | A1 * | 5/2004 | Kwong et al. | 174/260 |
| 2004/0136168 | A1 * | 7/2004 | Duxbury et al. | 361/748 |

* cited by examiner

*Primary Examiner*—Nathan W Ha
(74) *Attorney, Agent, or Firm*—Jim Zegeer

(57) ABSTRACT

A printed circuit board (PCB) assembly having a plurality of circuit layers including outer layers and intervening layers with through-vias and micro-vias used to translate a portion of the signal connections of the grid, thereby creating a set of diagonal routing channels between the vias on internal layers of the board and a BGA package mounted on the printed circuit board.

1 Claim, 8 Drawing Sheets

ALTERNATING MICRO-VIAS AND THROUGHBOARD VIAS TO CREATE PCB ROUTING CHANNELS IN BGA INTERCONNECT GRID

REFERENCE TO RELATED PATENT APPLICATIONS

The present application is related to the following U.S. patent applications which are assigned to the assignee hereof:

Ser. No. 10/991,360 filed Nov. 19, 2004, inventor Paul Brown entitled OFF-WIDTH PITCH FOR IMPROVED CIRCUIT CARD ROUTING; and Ser. No. 11/041,727 filed Jan. 25, 2005, inventor Alex Chan entitled OFF-GRID DECOUPLING OF BALL GRID ARRAY (BGA) DEVICES.

BACKGROUND OF THE INVENTION

This invention relates to increasing the efficiency with which signals from area array packages (BGAs and CGAs) are extracted and routed on the printed circuit boards (PCB or circuit card) on which these devices are mounted.

It is well established that the increase in area array connections (pin count) translates to an increase in the number of printed circuit board routing layers needed to support the device escape and routing. The incentive for further increases in routing efficiency stems from the cost and complications related to the added layers needed for typical routing methodologies.

At one extreme, where the area array pin count may be relatively low, implementation of higher efficiency routing methodologies are driven solely by the cost savings associated with the resulting lower layer count PCB.

As pin count increases above 1000 pins, limitations in high layer count PCB fabrication capabilities, shift the incentive towards minimizing the overall layer count, thereby improving the quality and reliability of a PCB for a given design, while also allowing the design to benefit from cost savings.

Finally, at the other extreme, area array technology is following a design trend towards higher pin counts (>2500) and finer pitches (<0.8 mm) which may not be usable at all, without improved routing solutions like the one proposed.

The prior art has used shared through-vias on power and ground connections aligned in columns in order to form a routing channel (i.e. a larger space between the row of shared vias and an adjacent row) through which connections can be routed. (See FIG. 1).

The prior art solution places additional constraints on the pinout configuration of the area array device power and ground pins, which require a high degree of adherence to a specific pinout pattern which in the extreme may not be achievable by certain area array packaging styles. In general, these added constraints are undesirable from a signal integrity standpoint. Furthermore that solution involves the sharing of adjacent power and ground pins which is also an unfavorable practice due to the negative impact that it might have on device functionality.

THE PRESENT INVENTION

Simple patterns, created through the intelligent reconfiguration of printed circuit board interconnect structures, have been discovered which permit an increase in escape densities that in turn enable the routing of area array devices in fewer layers.

By interspersing micro-via and through-via interconnect, diagonal rows of contacts can be addressed by interconnect that align on the diagonal. As a result, diagonal routing channels are created on the first and subsequent internal layer of the printed circuit board. These diagonal channels have several properties which favor the densification of routing: They are wider than orthogonal routing channels, thereby enabling the passage of a greater number of circuit traces. Additionally, the pattern created provides a diagonal set of routing channels on the second and subsequent layers of the board running parallel or at right angles to the channels on the first internal layer. These broader routing channels can permit orthogonal routing of adjacent layers, thereby minimizing the potential for cross talk between signal traces on these layers. Finally, the micro-vias employed in this invention cease to exist on the first internal layer, meaning that half of the interconnect is eliminated on all subsequent layers, thinning the interconnect to half of its original density in those areas where this technique is employed.

While in theory any pinout configuration can be accommodated by this invention, in practice it is best to route power and ground connections with through-vias, leaving the micro-vias for the signal carrying connections. Given that every second via is designated a through-via, the limitation that this preference imposes on a given pinout is not overly burdensome.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
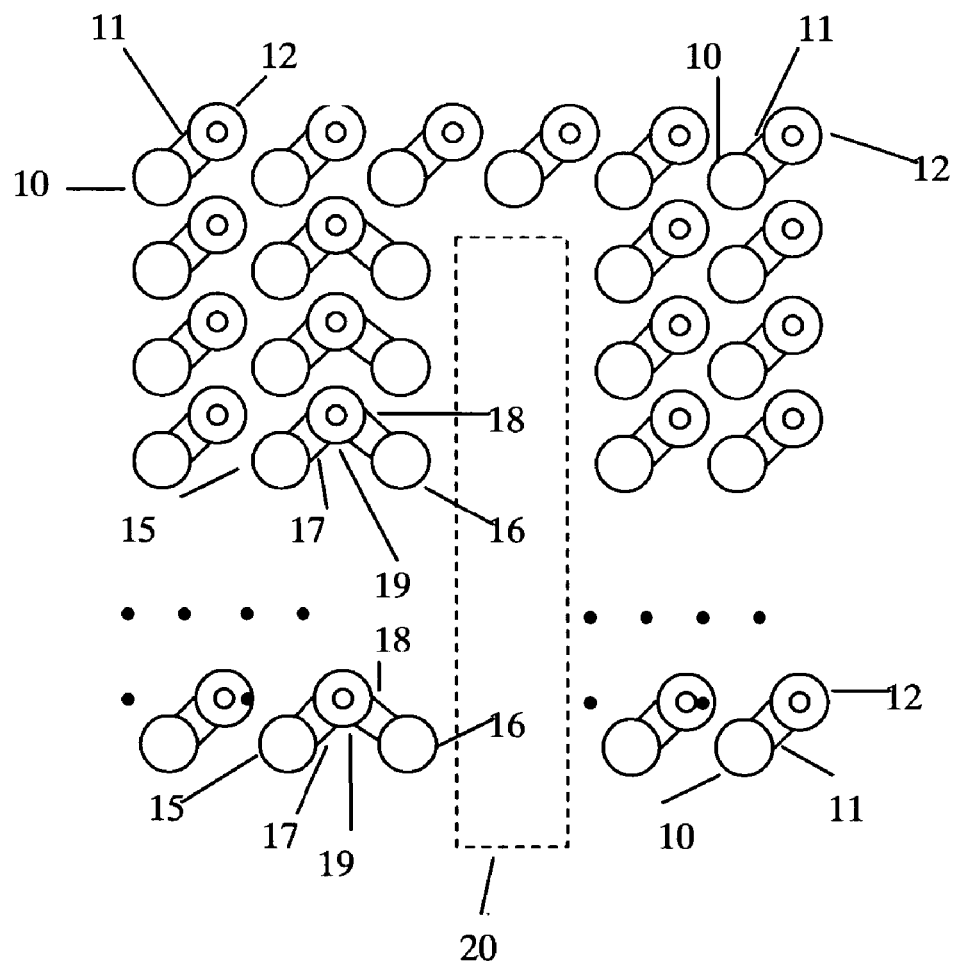
FIG. 1 is a diagrammatic illustration of a prior art printed circuit board solution.

Referring to FIG. 1, it is a top view of a surface layer of a printed circuit board (PCB) incorporating one prior art solution. Ball grid array (BGA) ball contact pads 10 are linked by links 11 to through-board vias 12. In order to provide a routing channel 20, selected rows of ball contact pads 15 and 16 are connected through links 17 and 18 to common through-board vias 19 which are designated herein as shared through-board vias. See the above discussion for the disadvantages of this solution.

Simple patterns, created through the intelligent reconfiguration of printed circuit board interconnect structures have been identified, which permit an increase in escape densities that in turn enable the routing of area array devices in fewer layers.

Figure 2A:
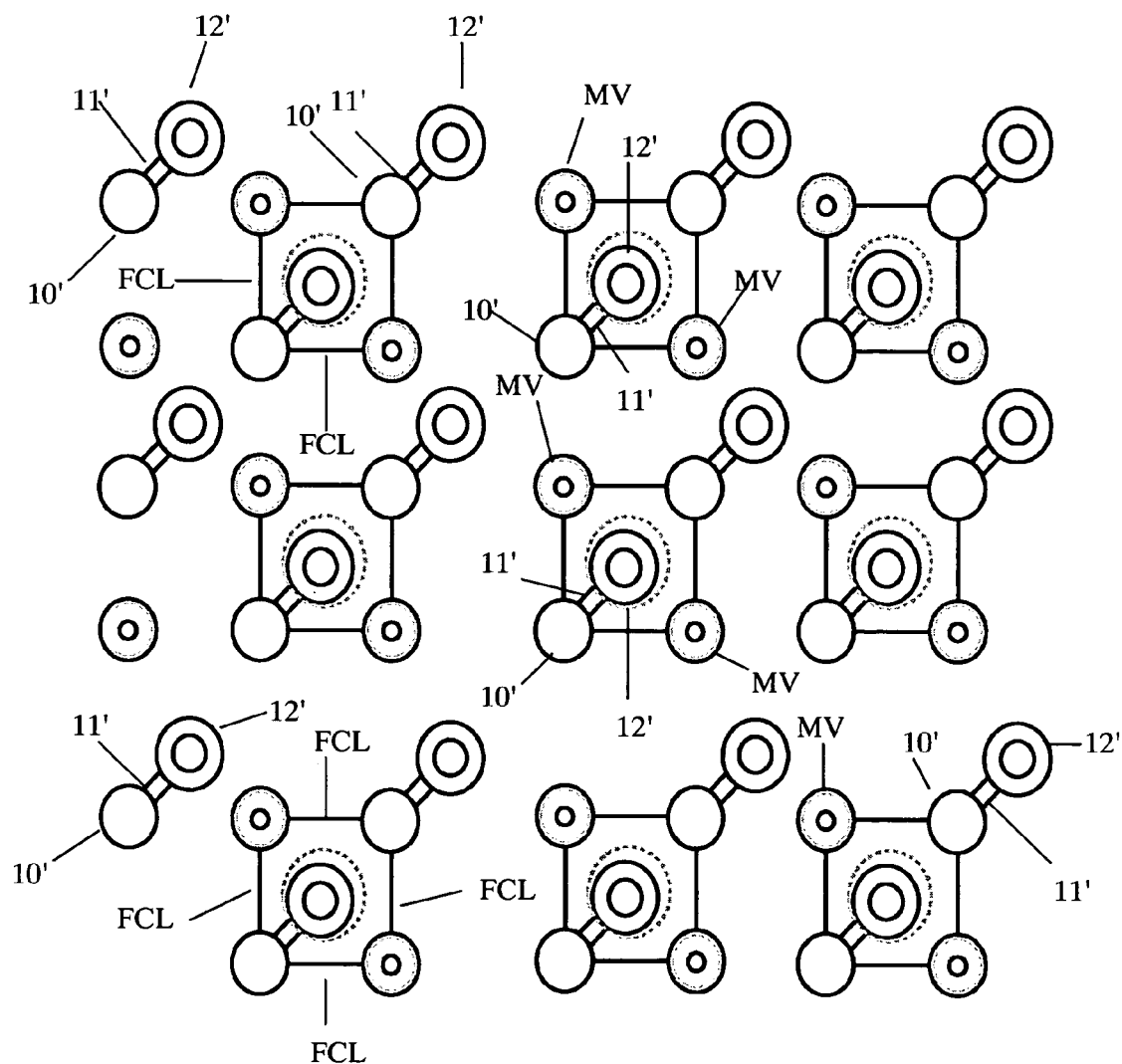
FIGS. 2a, 2b and 2c are diagrammatic representations of layers 1, 2 and 3, respectively, of a PCB incorporating the invention.
Figure 2B:
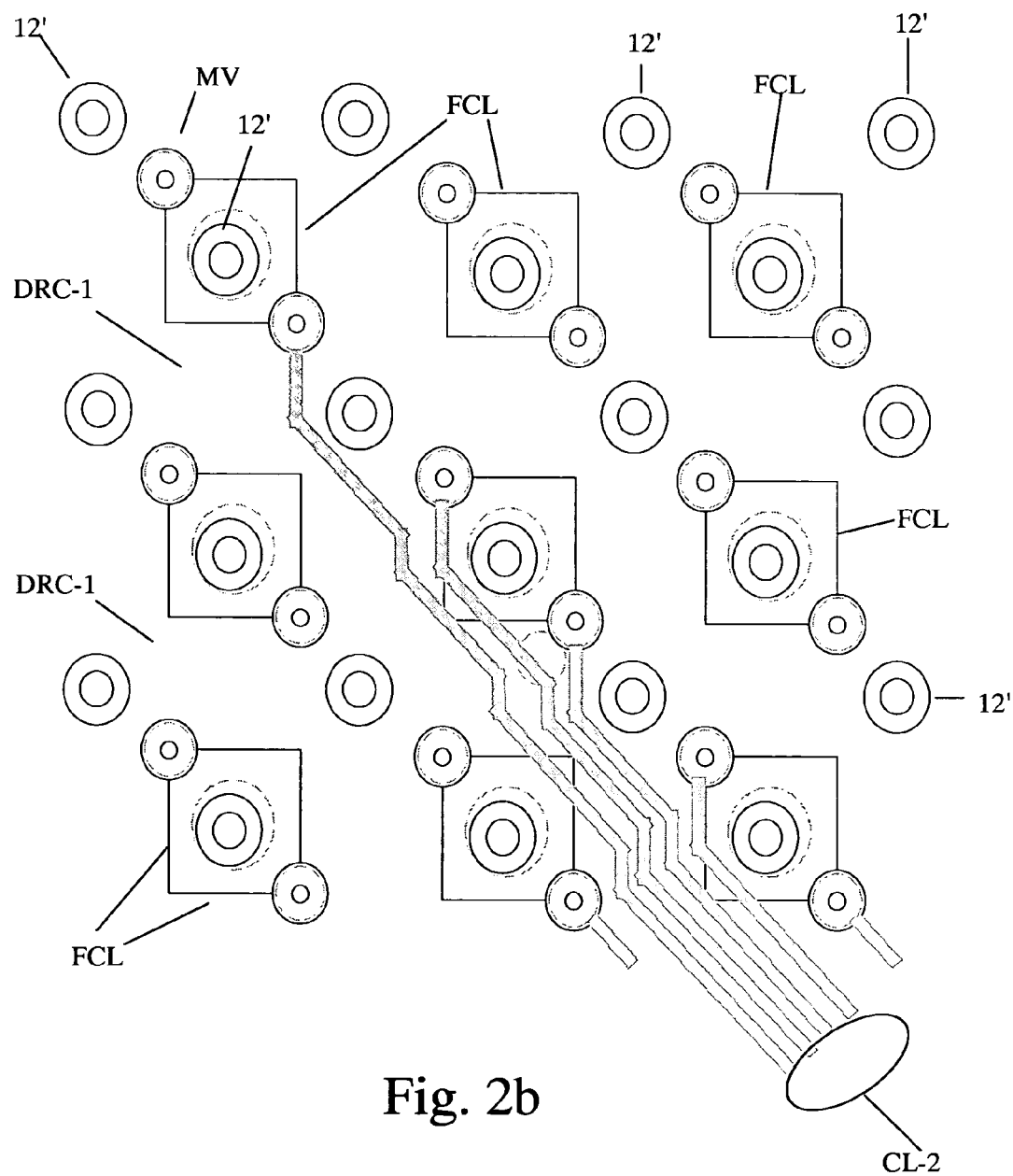
Figure 2C:
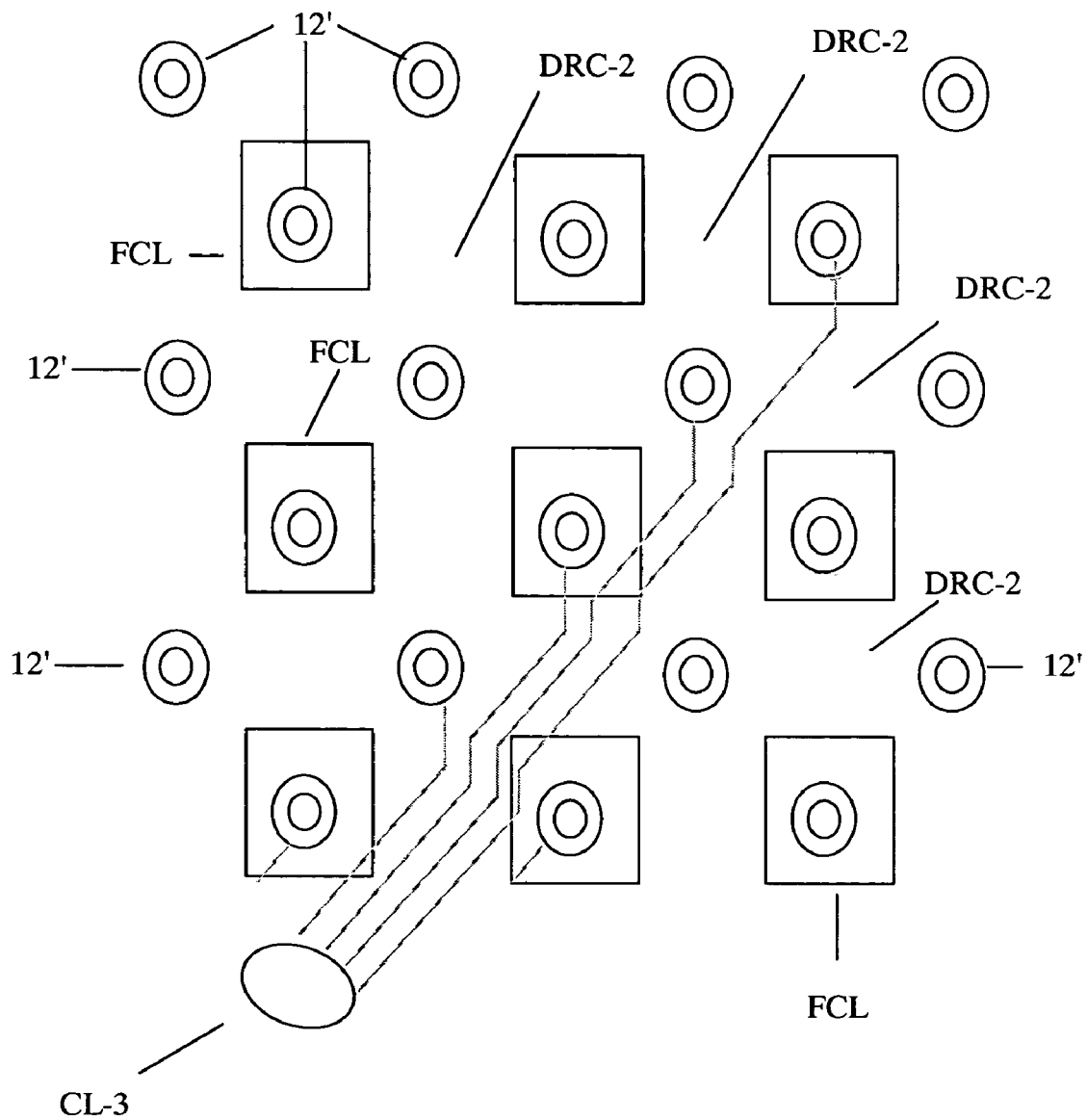

Referring to FIGS. 2a, 2b and 2c, by interspersing micro-via MV and through-via 12' interconnect, diagonal rows of contacts can be addressed by interconnect that align on the diagonal (see FIG. 2a). (The elements with prime numerals correspond to elements in FIG. 1.) As a result, diagonal routing channels DRC are created on the first internal layer of the printed circuit board (see FIG. 2b). These diagonal routing channels DRC have several properties which favor the densification of routing: They are wider than orthogonal routing channels, thereby enabling the passage of a greater number of traces. Additionally, the pattern created provides a diagonal set of routing channels DRC on the second and subsequent layers of the board running parallel or at right angles to the channels on the first internal layer (see FIG. 2c). These broader routing channels can permit orthogonal routing of adjacent layers, thereby minimizing the potential for cross talk between signal traces on these layers. Note that the circuit lines CL-2 in FIG. 2b may angle downwardly to the right while the circuit lines CL-3 in FIG. 2c may angle downwardly to the left. Finally, the micro-vias MV employed in this invention cease to exist on the first internal layer, meaning that half of the interconnect is eliminated on all subsequent layers, thinning the interconnect to half of its original density in those areas where this technique is employed (see FIG. 2c). (In FIGS. 2a, 2b and 2c, fictitious construction lines FCL delineate the original BGA pitch and highlight the effect of interconnect transformation according to the invention.)

Figure 3A:
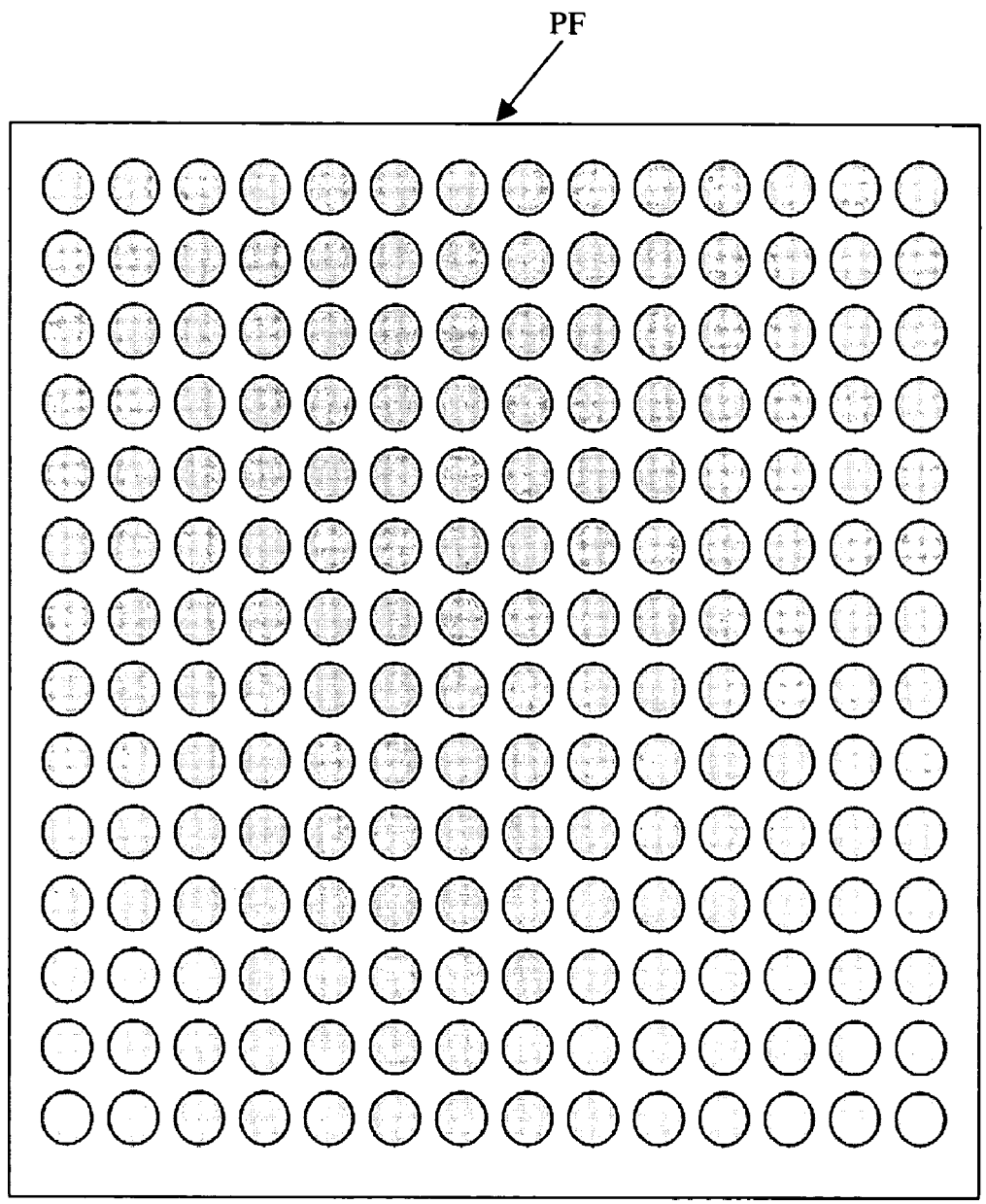
FIG. 3a is a diagrammatic illustration of an unaltered area array (BGA) pin field.
Figure 3B:
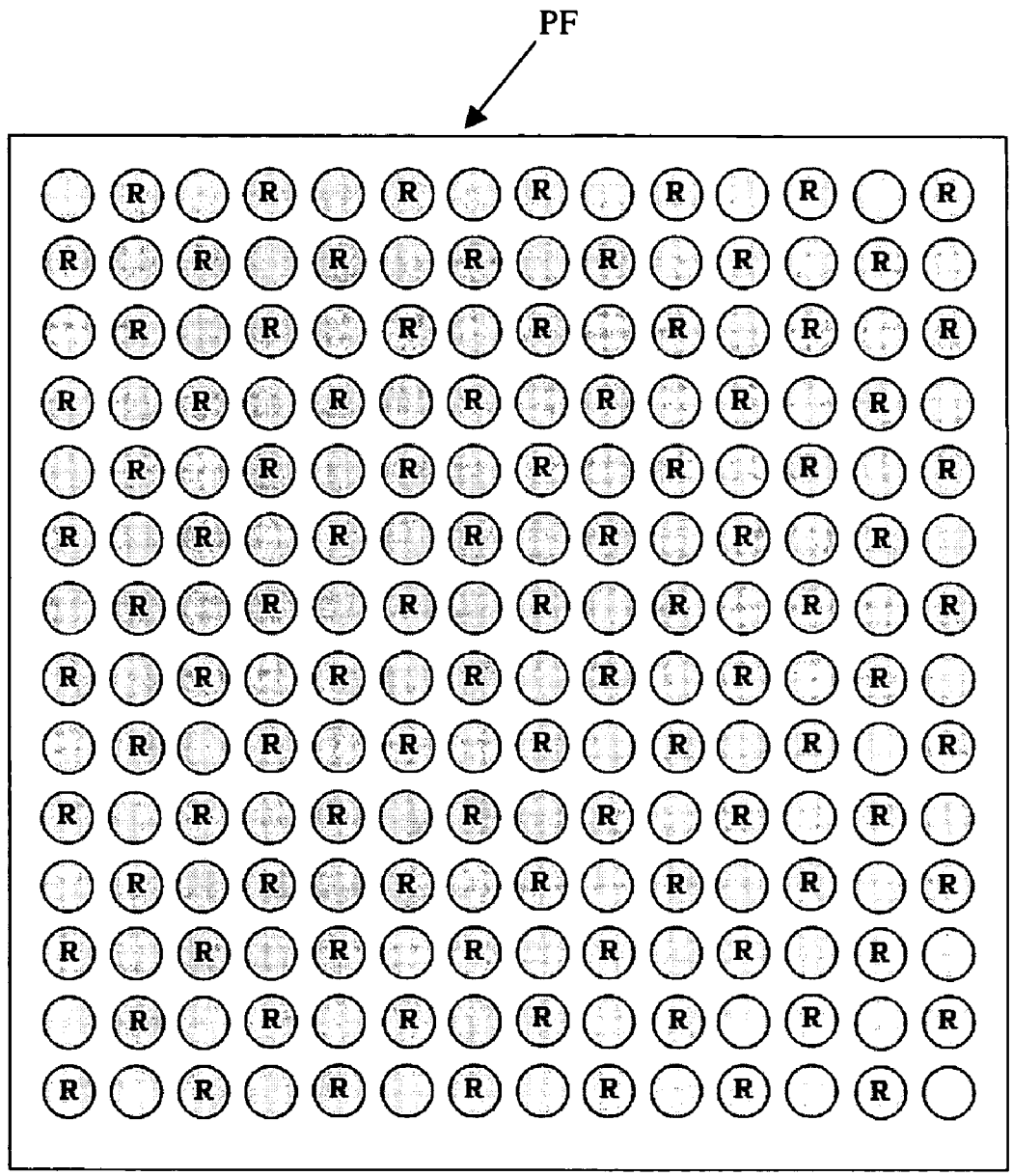
FIG. 3b is a diagrammatic illustration of an optimum BGA pinout in which preferential signal pins are reserved (R) for corresponding micro-vias.
Figure 3C:
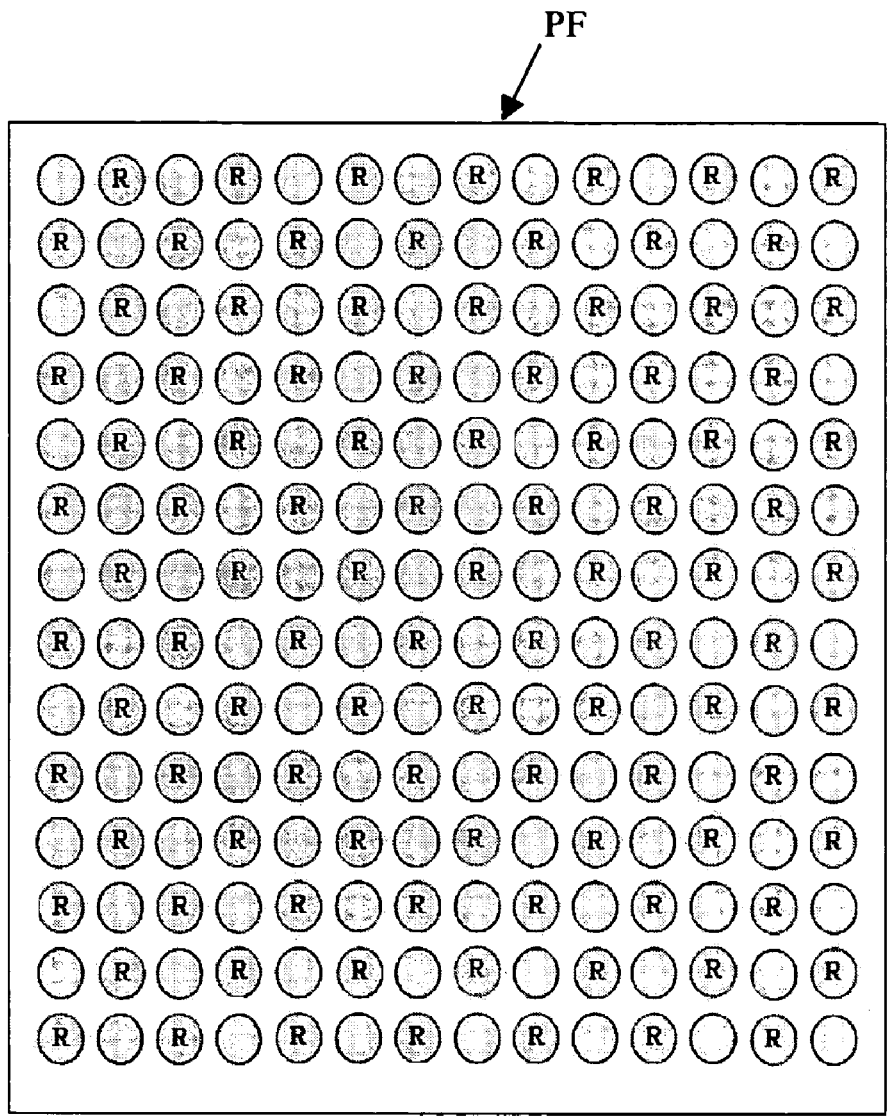
FIG. 3c is a diagrammatic illustration of future channel locations shown corresponding to signal pin locations.
Figure 3D:
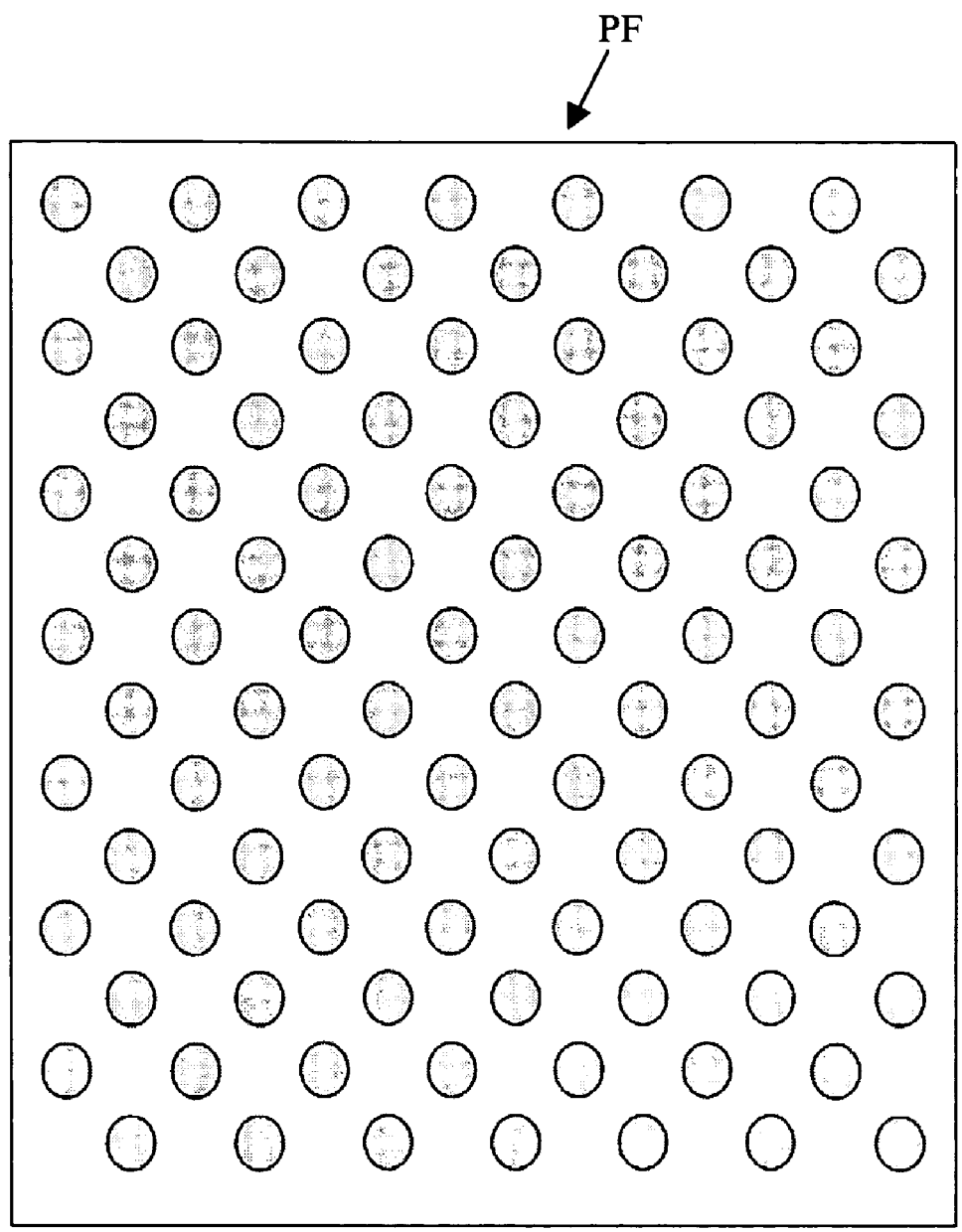
FIG. 3d is a diagrammatic illustration of remaining pin locations for pins requiring through-via interconnects.

Referring now to FIGS. 3a-3d, FIG. 3a is an illustration of the unaltered area array (BGA) pin field PF. FIG. 3b illustrates diagrammatically one optimum BGA pinout in which the preferential signal pins are reserved (R) for corresponding micro-vias shown in FIGS. 2a, 2b and 2c. The BGA's package pinout is characterized in that the power and ground pins are preferably laid out such that they do not fall on alternating contact locations in any given row so that they do not fall on the micro-vias locations as exemplary designated by the R pin locations. The remaining pin locations shown in FIG. 3d (with the reserved pin locations not shown for clarity) are pins which require through-via interconnects.

While in theory any pinout configuration can be accommodated by this invention, in practice it is best to route power and ground connections with through-vias, leaving the micro-vias for the signal carrying connections. Given that every second via is designated a through-via, the limitation that this preference imposes on a given pinout is not overly burdensome.

It will be appreciated that a software tool which automates the creation and associated routing of this grid translation method are in the contemplation of the invention. This software tool could also be used by the designer of the area array device to achieve the optimum pinout.

The present embodiment has the advantage that it creates effective routing channels with minimal detrimental impact to signal integrity or chip decoupling solutions.

Further advantages of the present solution include:
1. Provides the capability to route high pin count devices (i.e. >1200 pins) using available board technology. This ensures supply while reducing the cost of high complexity substrates by as much as 50%.
2. Simplifies chip escape and increases routing flexibility thereby minimizing design time and by consequence overall time to market.
3. Given that high pin count devices often unnecessarily drive layer count above what is needed for the actual design routing. This solution minimizes this effect, making designs more efficient and cost effective.

Although in the optimum configuration, this solution puts some limitations on the placement of power and ground connections, since typically half of the positions are still available for power and ground, and up to only a third of the connections are typically used for power and ground, this limitation should not be too onerous.

While the invention has been described in relation to preferred embodiments of the invention, it will be appreciated that other embodiments, adaptations and modifications of the invention will be apparent to those skilled in the art.

What is claimed is:

1. A printed circuit board (PCB) having a plurality of circuit layers including an outer layer, said outer layer having at least one ball grid array (BGA) contact pad grid pattern, said PCB having a first internal layer and subsequent internal layers with through-via interconnects and micro-vias at said BGA contact pads in a grid pattern to translate a portion of the signal connections of the BGA contact grid pattern, thereby creating one or more diagonal circuit routing channels between the through-vias on at least one subsequent internal layer of the PCB, and a BGA package on said BGA contact pad, said BGA package characterized in that power and ground connection pins are laid out such that they only fall on and coincide with through-via contacts and do not fall on any micro-via.

* * * * *